(12) United States Patent
Lin (10) Patent No.: US 8,558,319 B2
(45) Date of Patent: Oct. 15, 2013

(54) SEMICONDUCTOR MEMORY DEVICES AND METHODS OF MANUFACTURING THE SAME

(75) Inventor: Lo-Yueh Lin, Dongshan Shiang (TW)

(73) Assignee: Macronix International Co., Ltd., Hsin-Chu (TW)

( * ) Notice: Subject to any disclaimer, the term of this patent is extended or adjusted under 35 U.S.C. 154(b) by 126 days.

(21) Appl. No.: 13/172,449

(22) Filed: Jun. 29, 2011

(65) Prior Publication Data

US 2013/0001669 A1   Jan. 3, 2013

(51) Int. Cl.
*H01L 21/70* (2006.01)
(52) U.S. Cl.
USPC ............ 257/374; 257/446; 257/501; 257/316

(58) Field of Classification Search
USPC .................................. 257/374, 446, 501, 316
See application file for complete search history.

(56) References Cited

U.S. PATENT DOCUMENTS

2006/0076616 A1 *   4/2006   Wang et al. ................... 257/330

* cited by examiner

*Primary Examiner* — Tan N Tran
(74) *Attorney, Agent, or Firm* — Alston & Bird LLP (57) ABSTRACT

A semiconductor memory device includes a substrate and a plurality of rows of memory cells. The substrate comprises a plurality of isolation structures and a plurality of active regions. Each of the active regions is spaced apart from another active region by one of the isolation structures. In a cross-section of the substrate between two rows of memory cells in a direction parallel to the two rows of memory cells, a maximum height of each isolation structure with respect to a bottom of the substrate is lower than or equal to minimum heights of active regions adjacent thereto.

17 Claims, 11 Drawing Sheets

SEMICONDUCTOR MEMORY DEVICES AND METHODS OF MANUFACTURING THE SAME

BACKGROUND OF THE INVENTION

The present invention generally relates to a method for manufacturing a semiconductor device, and the semiconductor device manufactured according to the method. More particularly, it relates to a method for removing poly silicon stringers during the fabrication of a semiconductor memory device, without damaging the profile of the semiconductor memory device, and the semiconductor memory device manufactured according to the method.

Figure 1A:
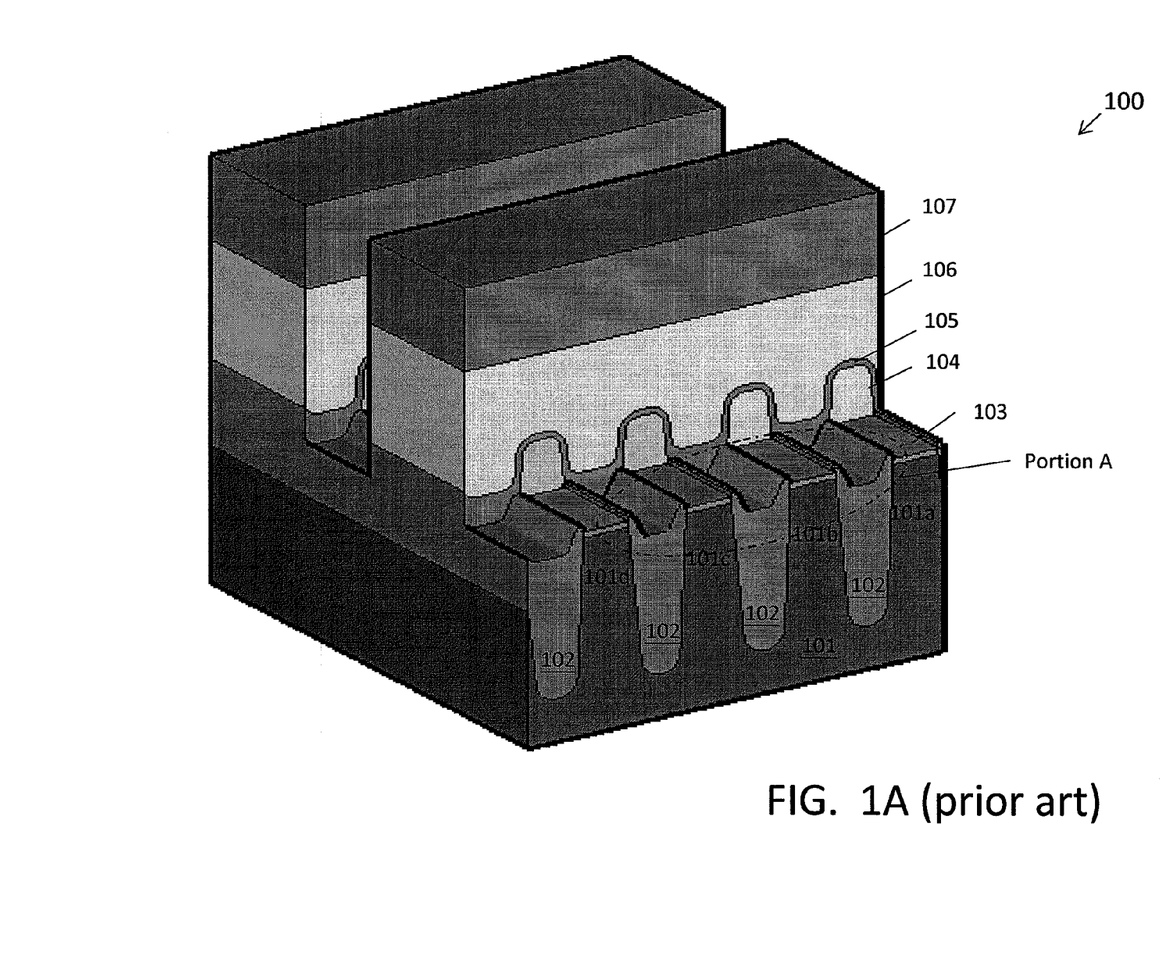
FIG. 1A is a 3D perspective view of a semi-finished semiconductor memory device in prior art.

Conventionally, fabricating a semiconductor memory device, such as a flash memory device or a charge-trapping device, involves at least three stages, including a first stage for providing columns of isolation structures and defining active regions in a substrate; a second stage for providing rows of memory cells on the substrate; and a third stage for providing an interlayer insulating film on the array of memory cells and forming wiring layers. FIG. 1A shows a three dimensional (3D) perspective view of a semiconductor memory device 100 obtained near the end of the second stage in prior art. The semiconductor memory device 100 comprises a substrate 101 and a plurality of isolation structures 102. The plurality of isolation structures 102 defines a plurality of active regions 101a to 101d in the substrate 101. The semiconductor memory device 100 further comprises a plurality of rows of memory cells provided on the substrate 101. Each row of memory cell comprises a patterned first dielectric layer 103, a patterned first conductive layer 104, a second dielectric layer 105, a second conductive layer 106 and a third dielectric layer 107.

Many different methods and processes may be applied for manufacturing the semiconductor memory device 100 shown in FIG. 1A. For example, the plurality of isolation structures 102 may first be provided in the substrate 101. The patterned first dielectric layer 103 may be provided together with the plurality of isolation structures 102. Subsequently, the patterned first conductive layer 104, the second dielectric layer 105, the second conductive layer 106, and the third dielectric layer 107 may be provided on the substrate 101. Following which, an etching processes may be carried out to form the rows of memory cells as shown in FIG. 1A.

Figure 1B:
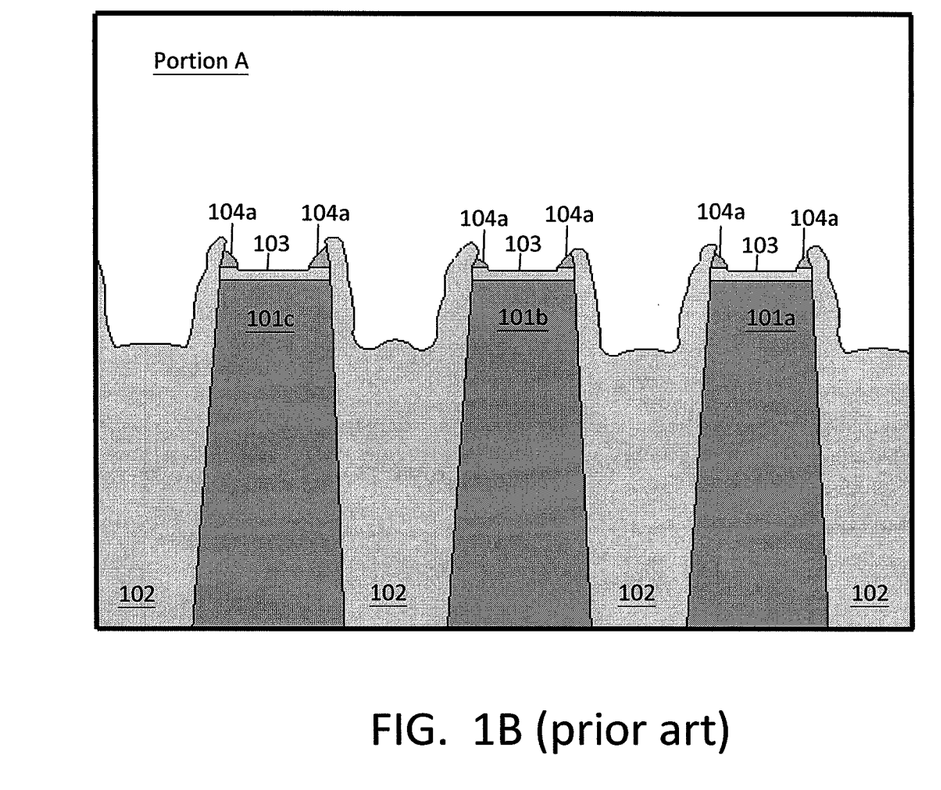
FIG. 1B is a cross-sectional view of a portion of the device in FIG. 1A.

FIG. 1B is a magnified view of portion A in FIG. 1A. It is a cross-sectional view of the semiconductor device 100 in a region between two adjacent rows of memory cells in a direction parallel to the rows of memory cells. After the etching processes, poly silicon stringers 104a, which are residues of the patterned first conductive layer 104, often remain on the patterned first dielectric layer 103 as shown in FIG. 1B. The poly silicon stringers 104a may cause current to flow from a memory cell in a first row to another memory cell in an adjacent row, and thus have to be removed. Conventionally, the poly silicon stringers 104a are removed by wet etching treatment. However, removing poly silicon stringers using the conventional methods may often damage the profile of the semiconductor memory device. Moreover, wet etching treatments make the controlling of the critical dimension of the semiconductor memory device difficult. Therefore, it is desirable to provide a method for manufacturing a semiconductor memory device involving a step for removing the poly silicon stringers completely, without damaging the profile of the semiconductor memory device.

BRIEF SUMMARY OF THE INVENTION

Examples of the present invention may provide a semiconductor memory device that comprises a substrate and a plurality of rows of memory cells provided on the substrate. The substrate has a first surface and a second surface spaced apart from the first surface, and may comprise a plurality of isolation structures and a plurality of active regions. The plurality of rows of memory cells are provided on the first surface of the substrate. Each of the isolation structures may comprise a dielectric material, and each of the active regions is spaced apart from another active region by one of the isolation structures. In a cross-section of the substrate between two rows of memory cells in a direction parallel to the two rows of memory cells, a maximum height of each isolation structure with respect to the second surface of the substrate is lower than or equal to minimum heights of active regions adjacent thereto.

Some examples of the present invention may provide a method of manufacturing a semiconductor memory device. The method may comprise the steps of providing a substrate that has a first surface and a second surface spaced apart from the first surface; forming a plurality of isolation structures and a plurality of active regions in the substrate, wherein each of the isolation structures comprises a dielectric material; providing a plurality of rows of memory cells on the first surface the substrate; and sputter etching using non-reactive gas so that in a cross-section of the substrate between two rows of memory cells in a direction parallel to the two rows of memory cells, a maximum height of each isolation structure with respect to the second surface of the substrate is lower than or equal to minimum heights of active regions adjacent thereto.

Some other examples of the present invention may provide a semiconductor memory device that comprises a substrate and a plurality of rows of memory cells. The substrate has a first surface and a second surface spaced apart from the first surface, and may comprise a plurality of isolation structures spaced apart in a first direction and a plurality of active regions. The plurality of rows of memory cells may be provided on the first surface of the substrate and are spaced apart in a second direction, wherein, in a cross-section of the substrate between two rows of memory cells in the first direction, a maximum height of each isolation structure with respect to the second surface of the substrate is lower than or equal to minimum heights of active regions adjacent thereto.

Additional features and advantages of the present invention will be set forth in portion in the description which follows, and in portion will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, examples are shown in the drawings. It should be understood, however, that the invention is not limited to the precise arrangements and instrumentalities shown in the examples.

In the drawings.

DETAILED DESCRIPTION OF THE INVENTION

Reference will now be made in detail to the present examples of the invention illustrated in the accompanying drawings. Wherever possible, the same reference numbers will be used throughout the drawings to refer to the same or like portions. It should be noted that the drawings are in greatly simplified form and are not to precise scale.

Figure 2:
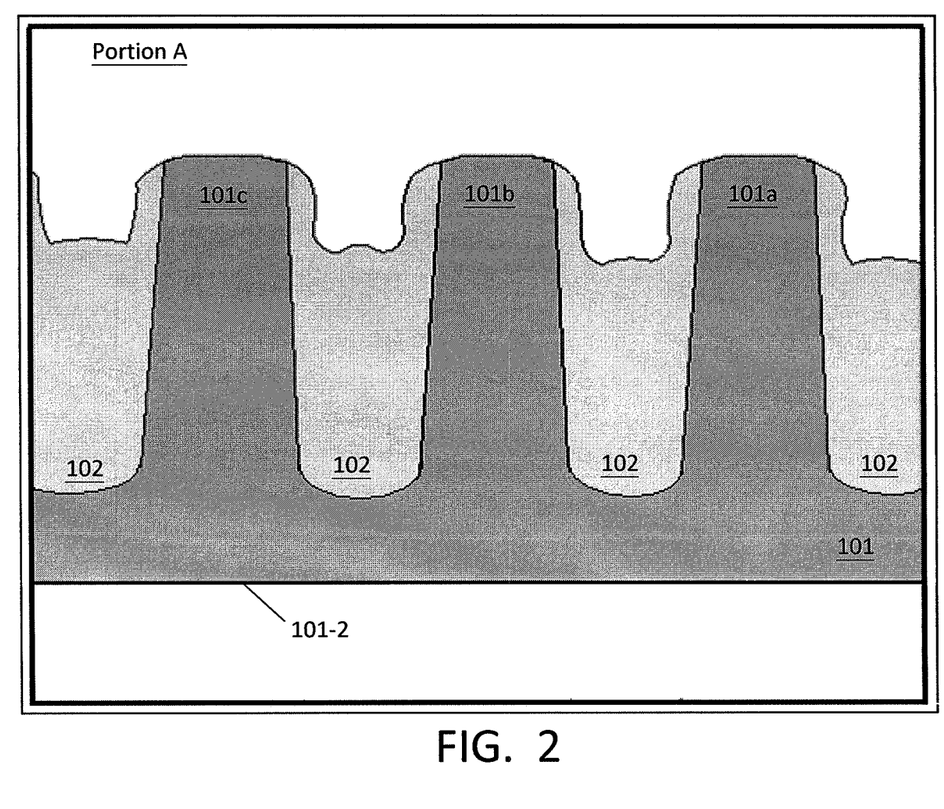
FIG. 2 is a cross-sectional view of a semi-finished semiconductor memory device fabricated in accordance with an example of the present invention.

FIG. 2 is a cross-sectional view of a semiconductor memory device 200 manufactured according to a method of the present invention. As shown in FIG. 2, the poly silicon stringers and the sharp profiles of the isolation structures as shown in FIG. 1B have been removed. Furthermore, the maximum height of each isolation structure 102 with respect to a second surface 101-2 of the substrate 101 is lower than or equal to the minimum heights of adjacent active regions 101a to 101c. According to an example of the present invention, the poly silicon stringers are removed by a simple in-situ non-reactive gas treatment. The method for removing poly silicon stringers by the in-situ non-reactive gas treatment is described below in reference to FIG. 3.

Figure 3:
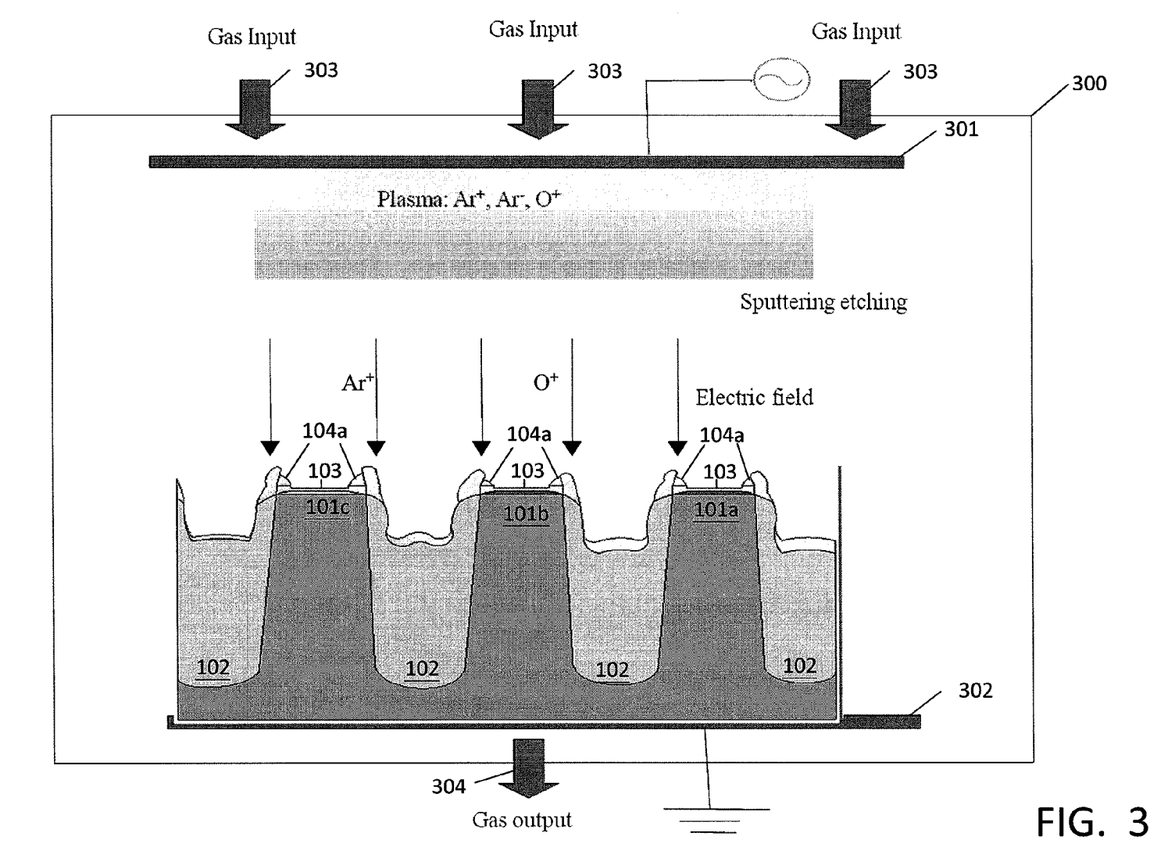
FIG. 3 is a schematic diagram of a system for performing a poly silicon stringers removal process in accordance with an example of the present invention.

Referring to FIG. 3, the semiconductor memory device with the poly silicon stringers is placed in a vacuum chamber 300. The vacuum chamber 300 may comprise an upper electrode 301 and a lower electrode 302. The lower electrode 302 may be configured to hold the semiconductor memory device, and be grounded and electrically isolated from the rest of the vacuum chamber 300. The vacuum chamber 300 further comprises gas inlets 303 in the top portion of the vacuum chamber 300 and a pump 304 in the lower portion of the vacuum chamber 300, so that gas may enter the vacuum chamber 300 via the gas inlets 303 and exits to the pump 304. The gas entering the chamber 300 may comprise non-reactive gas which may include at least one of argon (Ar), oxygen ($O_2$), helium (He) and nitrogen ($N_2$). A power supply is connected to the chamber and configured to provide bias power to the chamber 300 for producing plasma from the gas and accelerate positive ions in the plasma towards the semiconductor memory device. The positive ions bombard the poly silicon stringers 104a and the patterned first dielectric layer 103 and isolation structures 102 between the rows of memory cells. After being bombarded for a predetermined time, the poly silicon stringers 104a are removed, and the protruding portions of the isolation structures 102 are also removed, resulting in the profile shown in FIG. 2.

An exemplary method for manufacturing a semiconductor memory device having a profile as shown in FIG. 2 according to the present invention will now be described in reference to FIGS. 4A to 4L.

Figure 4A:
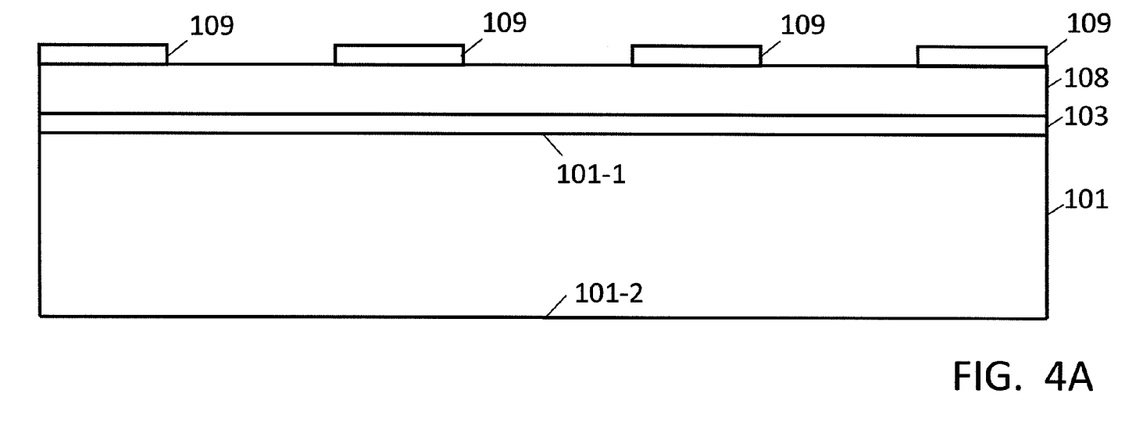
FIGS. 4A to 4L are schematic cross-sectional views illustrating a method of fabricating the semiconductor memory device in accordance with an example of the present invention.
Figure 4B:
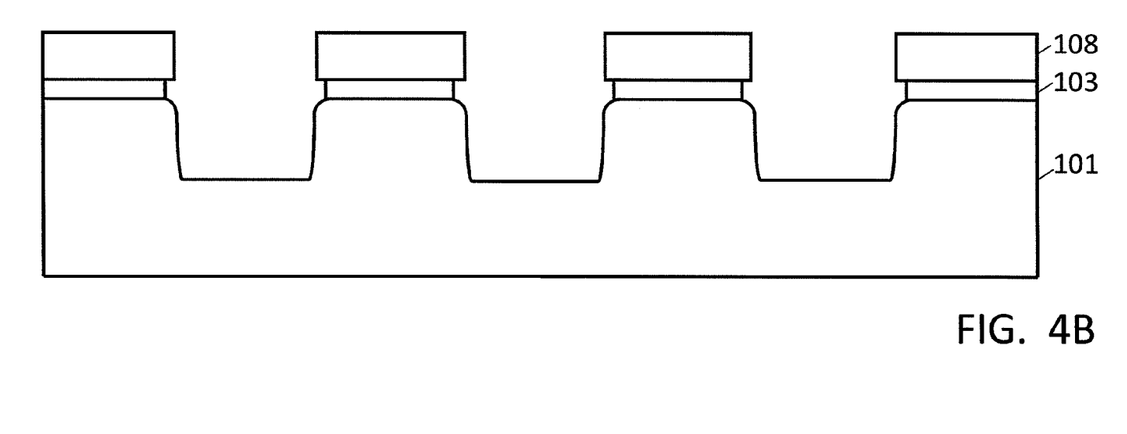
Figure 4C:
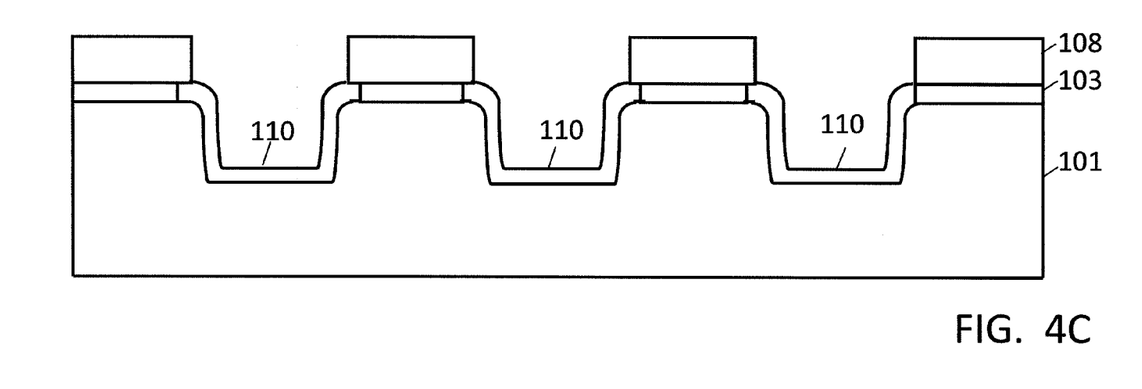
Figure 4D:
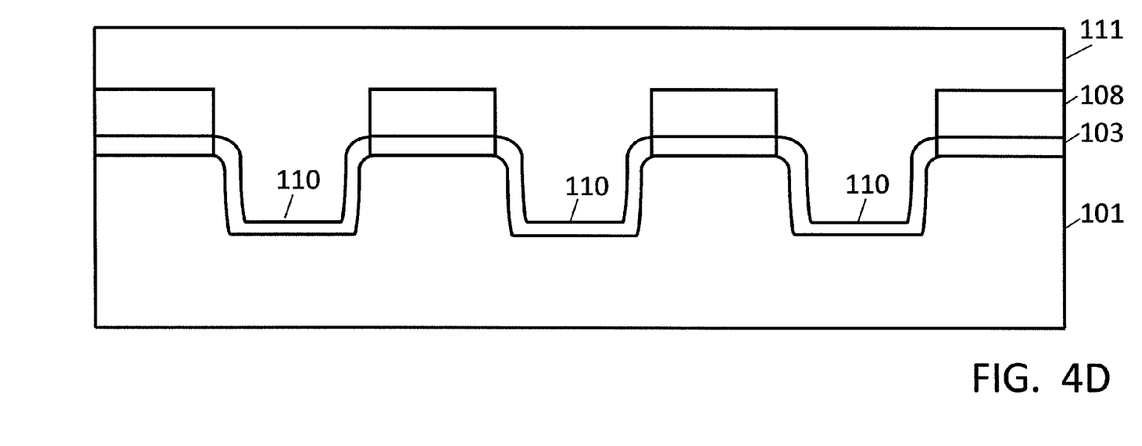
Figure 4E:
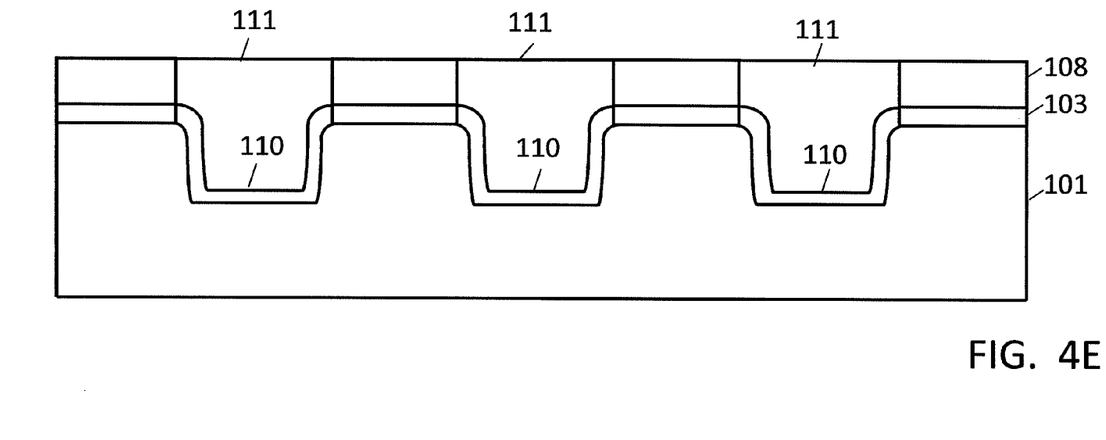
Figure 4F:
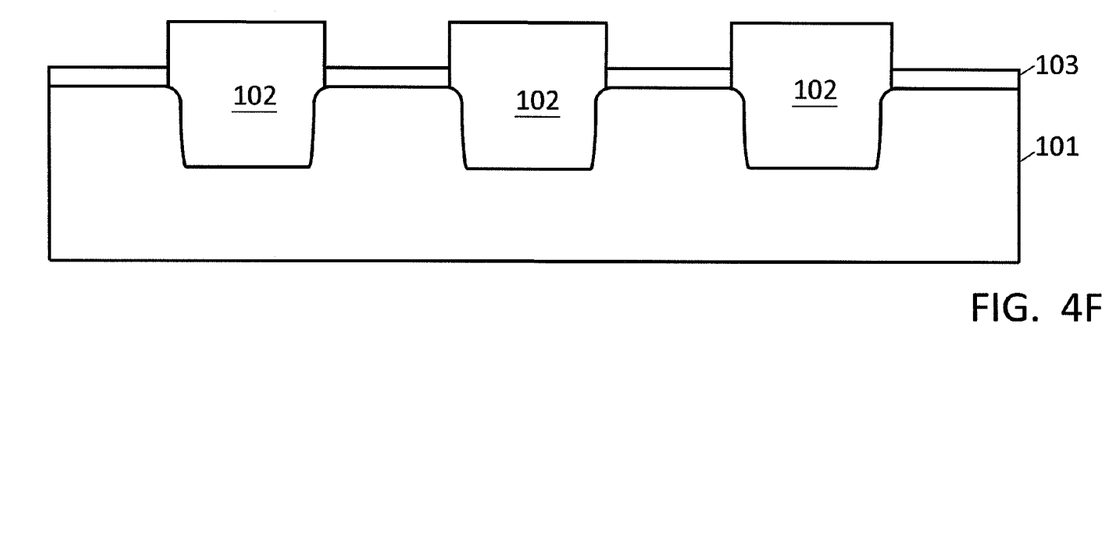

First, a plurality of isolation structures 102 may be provided in a substrate 101 by STI. The substrate 101 has a first surface 101-1 and a second surface 101-2 spaced apart from the first surface 101-1. The substrate 101 may comprise pure silicon, and may have a thickness between approximately 2000 to 2500 angstrom (Å). In an example according to the present invention, the substrate 101 is 2500 Å. Next, as shown in FIG. 4A, a first dielectric layer 103 is formed on the surface of the substrate 101. The first dielectric layer 103 may be silicon oxide formed by way of thermal oxidation. The first dielectric layer 103 may be approximately 75 to 95 Å. According to an example of the present invention, the first dielectric layer 103 is 85 Å thick. On top of the first dielectric layer 103, a nitride layer 108 is formed. Furthermore, a patterned photoresist layer 109 is formed on the nitride layer 108. Subsequently, as shown in FIG. 4B, the nitride layer 108, the first dielectric layer 103 and the substrate 101 are etched, using the patterned photoresist layer 109 as a mask. The etching process may be carried out using conventional dry etching or wet etching techniques. The first dielectric layer 103 may be under etched during the process. The patterned photoresist layer 109 is removed after the completion of the etching process. Subsequently, as shown in FIG. 4C, a thin layer of thermal oxide 110 may be formed. Following which, as shown in FIG. 4D, the rest of the trench is filled with a deposited oxide 111. Next, the excessive deposited oxide 111 is removed by way of chemical mechanical planarization (CMP) as shown in FIG. 4E. After which, the nitride layer 108 is removed and the isolation structures 102 and patterned first dielectric layer 103 are formed as shown in FIG. 4F.

Figure 4G:
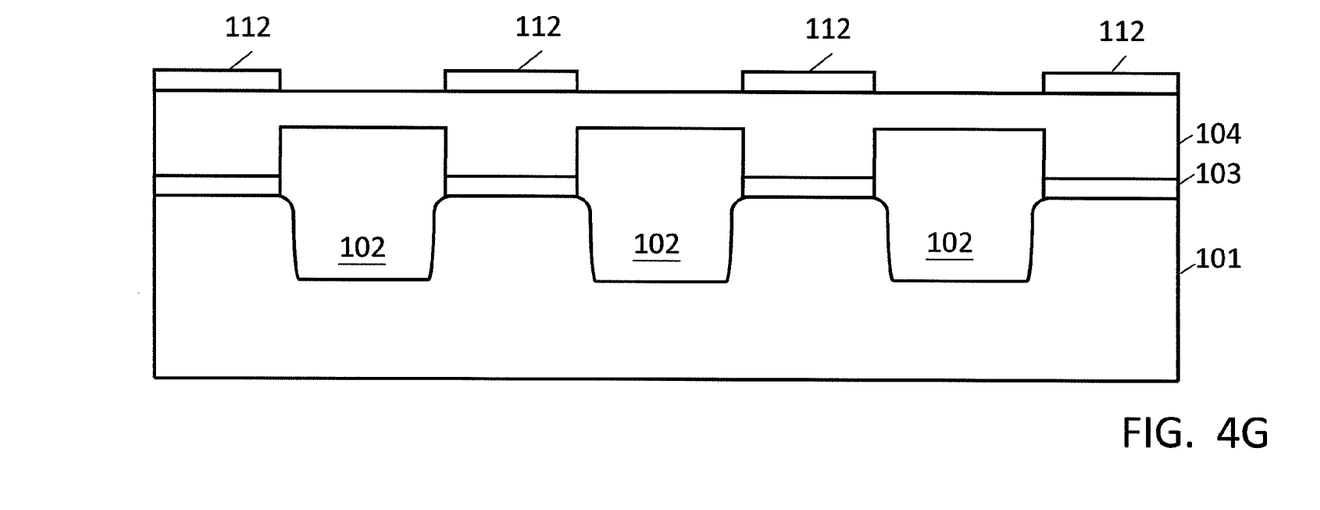
Figure 4H:
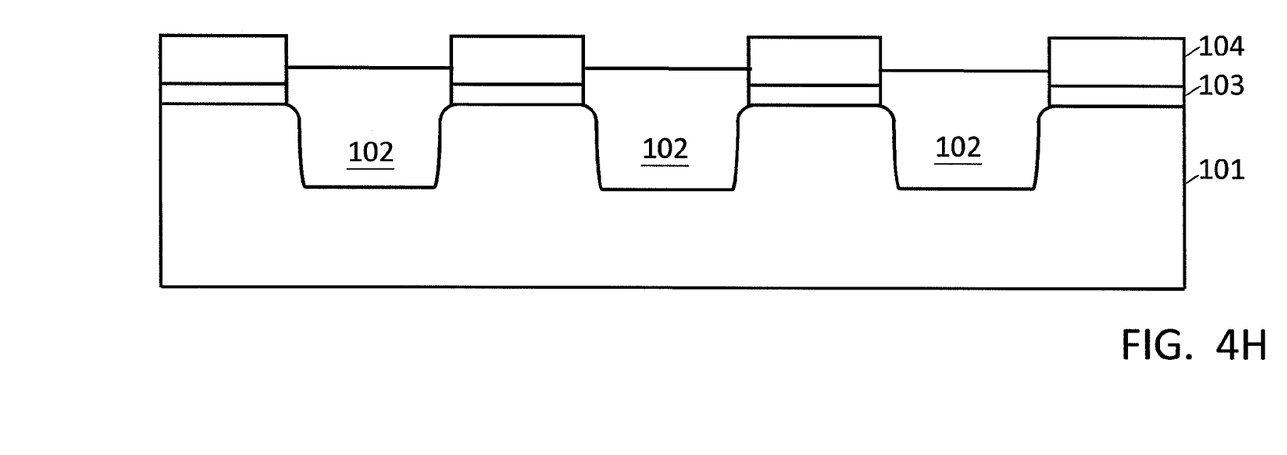
Figure 4I:
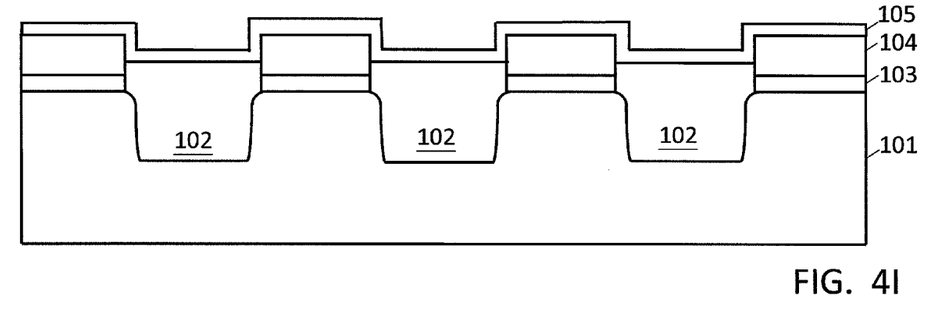
Figure 4J:
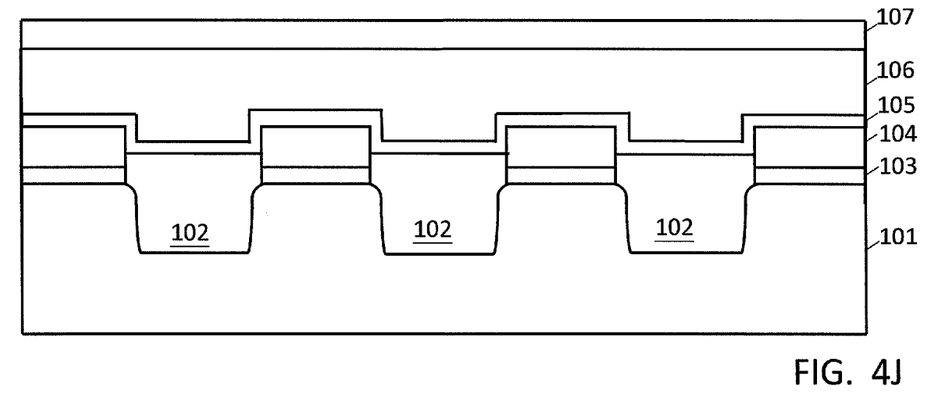
Figure 4K:
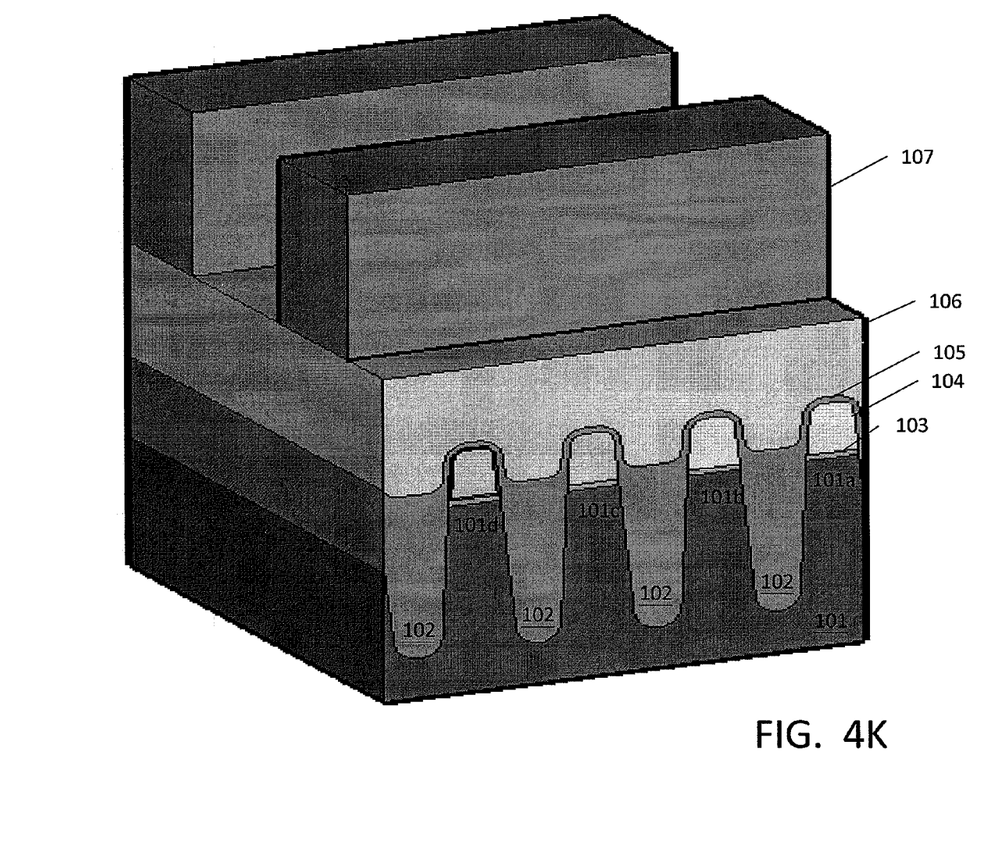

After the columns of isolation structures 102 are formed, rows of memory cells are provided on the substrate 101. For example, as shown in FIG. 4G, a first conductive layer 104 for forming the floating gates of the memory cells is deposited on the first dielectric layer 103 and the isolation structures 102. The first conductive layer 104 may comprise poly silicon, and may be approximately 900 to 1100 Å thick. According to an example of the present invention, the first conductive layer 104 is approximately 1000 Å. Furthermore, a patterned photoresist layer 112 is formed on the first conductive layer 104. Subsequently, the first conductive layer 104 is etched and then the layer of photoresist 112 is removed as shown in FIG. 4H. Next, as shown in FIGS. 4I and 4J, a second dielectric layer 105 is formed on the patterned first conductive layer 104, and a second conductive layer 106 is formed on the second dielectric layer 105. The second conductive layer 106 forms the control gates of the memory cells, which may comprise poly silicon and be approximately 1350-1550 Å thick. The second dielectric layer 105 may comprise silicon oxide or oxide-nitride-oxide (ONO) layer, and have a thickness between 125 to 155 Å. According to an example of the present invention, the thickness of the second dielectric layer 105 and the second conductive layer 106 are approximately 140 and 1500 Å, respectively. Following which, a third dielectric layer 107 is formed over the second conductive layer 106. The thickness of the third dielectric layer 107 may comprise silicon oxide and be approximately 2000 to 2500 Å thick. According to an example of the present invention, the third dielectric layer 107 is 2250 Å thick. Subsequently, the third dielectric layer 107 is patterned as shown in FIG. 4K. After which, etching processes are carried out to etch through the second conductive layer 106, the second dielectric layer 105 and the first conductive layer 104.

One skilled in the art may apply different techniques and processes to provide columns of isolation structures in a substrate and rows of memory cells on the substrate 101. As explained above, after etching through the first conductive layer 104, poly silicon stringers 104a will remain. To remove the poly silicon stringers 104a in accordance with the present invention, also referring to FIG. 3, the semiconductor memory device is placed in a vacuum chamber 300 for an in-situ non-reactive gas treatment. The semiconductor memory device is placed on the lower electrode 302, which is electrically isolated from the rest of the vacuum chamber 300. Non-reactive gas, which may comprise one or more of Ar, $O_2$, He and $N_2$ gas, is provided into the vacuum chamber 300 through gas inlets 303 at the top of the vacuum chamber 300. Furthermore, bias power is provided to generate an electric field for exciting the gas to provide plasma. The positive ions in the plasma accelerate towards the semiconductor device and bombard the poly silicon stringers 104a, the patterned first dielectric layer 103 and the isolation structures 102 in the regions between the rows of memory cells. The positive ions in the plasma will mainly bombard the poly silicon stringers 104a and the pointy ends of the patterned first dielectric layer 103, because more negative charges are gathered at the protruding ends of the patterned first dielectric layer 103. According to an example of the present invention, the pressure of the chamber 300 is set to 10 millitorr (mT), a bias power of 100 Watt (W) is provided to generate an electric field, and the substrate is bombarded by the ions for 30 seconds (s). The resulting semiconductor memory device has a cross-section as shown in FIG. 2, where the poly stringers 104a are removed and the maximum height of each isolation structure 102 with respect to the second surface 101-2 of the substrate 101 is lower or equal to the minimum heights of active regions 101a to d.

Figure 4L:
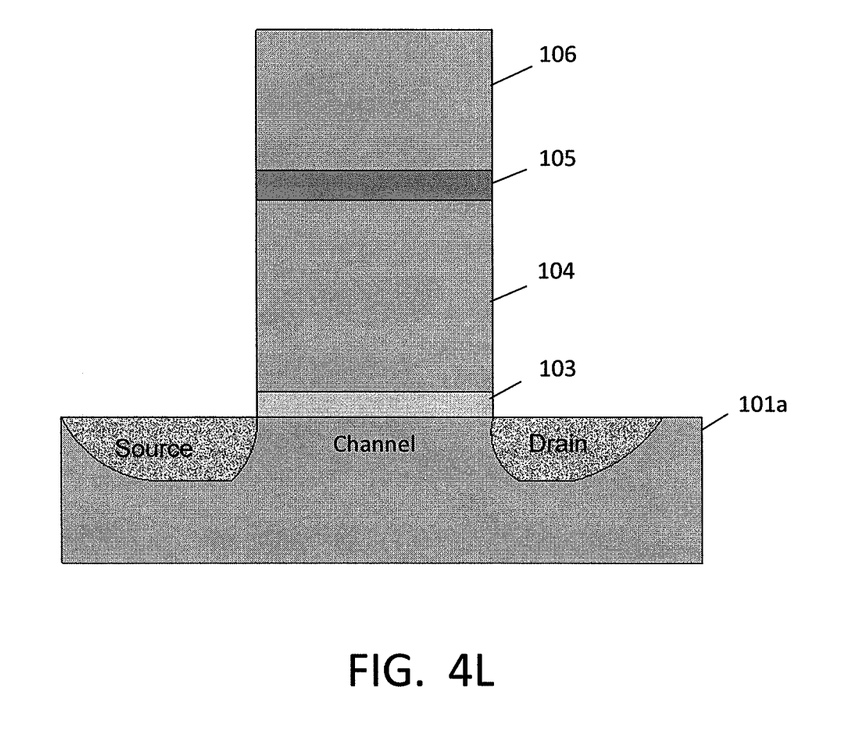

After the poly silicon stringers are removed according to the method of the present invention, ion implantation is performed to form the drain and source regions of each memory cell as shown in FIG. 4L. Subsequently, an interlayer insulating film (not shown) is deposited and wiring layers (not shown) are formed. The interlayer insulating film may comprise silicon oxide or a low-k material, which is a material with small dielectric constant relative to silicon oxide. Examples of a low-k material include carbon-doped silicon dioxide, fluorine-doped silicon dioxide. The wiring layer may comprise aluminum or copper.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

Further, in describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A semiconductor memory device comprising:
a substrate having a first surface and a second surface spaced apart from the first surface, wherein the substrate comprises
a plurality of isolation structures, wherein a height of the central portion of each of the isolation structures with respect to the second surface of the substrate is lower than a height of side portions of each of the isolation structures, and each of the isolation structures comprises a dielectric material; and
a plurality of active regions, wherein each of the active regions is spaced apart from another active region by one of the isolation structures; and
a plurality of rows of memory cells provided on the first surface of the substrate,
wherein the semiconductor memory device comprises a substantially continuous and smooth surface between the top of each of the active regions and the side portion of the adjacent isolation structures, and
in a cross-section of the substrate between two rows of memory cells in a direction parallel to the two rows of memory cells, a maximum height of each isolation structure with respect to the second surface of the substrate is lower than or equal to minimum heights of active regions adjacent thereto.

2. The device of claim 1, wherein each of the isolation structures between the rows of memory cells has a well formed therein.

3. The device of claim 1, wherein each row of memory cells comprises:
a patterned first dielectric layer formed on the substrate;
a patterned first conductive layer formed on the patterned first dielectric layer;
a second dielectric layer formed on the first conductive layer; and
a second conductive layer formed on the second dielectric layer.

4. The device of claim 3, wherein
the substrate comprises silicon;
each of the first and second conductive layers comprises poly silicon;
the dielectric material comprises silicon oxide; and
each of the first, second and third dielectric layers comprises one of thermal oxide, silicon oxide and oxide-nitride-oxide layer.

5. The device of claim 3, wherein the substrate is 2000-2500 Å thick, the first dielectric layer is 75-95 Å thick, the first conductive layer is 900-1100 Å thick, the second dielectric layer is 125-155 Å thick, the second conductive layer is 1350-1550 Å thick, and the third dielectric layer is 2000-2500 Å thick.

6. The device of claim 3 further comprises:
an interlayer insulating film and a wiring layer formed on the second conductive layer.

7. The device of claim 6, wherein
the interlayer insulating film comprises silicon oxide or a low-k material; and
the wiring layer comprises aluminum or copper.

8. The device of claim 1, wherein the plurality of isolation structures are parallel to a first direction, and the plurality of rows of memory cells are parallel to a second direction perpendicular to the first direction.

9. A semiconductor memory device comprising:
a substrate having a first surface and a second surface spaced apart from the first surface, wherein the substrate comprises
a plurality of isolation structures spaced apart in a first direction, wherein a height of the central portion of each of the isolation structures with respect to the second surface of the substrate is lower than a height of side portions of each of the isolation structures; and
a plurality of active regions; and a plurality of rows of memory cells provided on the first surface of the substrate and are spaced apart in a second direction, wherein the semiconductor memory device comprises a substantially continuous and smooth surface between the top of each of the active regions and the side portion of the adjacent isolation structures, and in a cross-section of the substrate between two rows of memory cells in the first direction, a maximum height of each isolation structure with respect to the second surface of the substrate is lower than or equal to minimum heights of active regions adjacent thereto.

10. The device of claim 9, wherein each of the isolation structures comprises a dielectric material; and each of the active regions is spaced apart from another active region by one of the isolation structures.

11. The device of claim 9, wherein each of the isolation structures between the rows of memory cells has a well formed therein.

12. The device of claim 11, wherein the substrate comprises silicon;

each of the first and second conductive layers comprises poly silicon;

the dielectric material comprises silicon oxide; and each of the first, second and third dielectric layers comprises one of thermal oxide, silicon oxide and oxide-nitride-oxide layer.

13. The device of claim 11, wherein the substrate is 2000-2500 Å thick, the first dielectric layer is 75-95 Å thick, the first conductive layer is 900-1100 Å thick, the second dielectric layer is 125-155 Å thick, the second conductive layer is 1350-1550 Å thick, and the third dielectric layer is 2000-2500 Å thick.

14. The device of claim 13, wherein the interlayer insulating film comprises silicon oxide or a low-k material; and the wiring layer comprises aluminum or copper.

15. The device of claim 11 further comprises:

an interlayer insulating film and a wiring layer formed on the second conductive layer.

16. The device of claim 9, wherein each row of memory cells comprises:

a patterned first dielectric layer formed on the substrate;

a patterned first conductive layer formed on the patterned first dielectric layer;

a second dielectric layer formed on the first conductive layer; and a second conductive layer formed on the second dielectric layer.

17. The device of claim 9, wherein the first direction is perpendicular to the second direction.

* * * * *